United States Patent
Nagaraj et al.

(10) Patent No.: US 8,134,393 B1
(45) Date of Patent: Mar. 13, 2012

(54) METHOD AND APPARATUS FOR CORRECTING PHASE OFFSET ERRORS IN A COMMUNICATION DEVICE

(75) Inventors: Geetha B. Nagaraj, Coral Springs, FL (US); Thomas R. Harrington, Margate, FL (US); Raul Salvi, Boca Raton, FL (US)

(73) Assignee: Motorola Solutions, Inc., Schaumburg, IL (US)

( * ) Notice: Subject to any disclaimer, the term of this patent is extended or adjusted under 35 U.S.C. 154(b) by 0 days.

(21) Appl. No.: 12/893,266

(22) Filed: Sep. 29, 2010

(51) Int. Cl.
  *H03L 7/06* (2006.01)
(52) U.S. Cl. ......................................... 327/156; 327/147
(58) Field of Classification Search ................... 327/147, 327/156
  See application file for complete search history.

(56) References Cited

U.S. PATENT DOCUMENTS

| | | | |
|---|---|---|---|
| 4,378,509 A | 3/1983 | Hatchett et al. | |
| 4,764,737 A | 8/1988 | Kaatz | |
| 4,970,475 A | 11/1990 | Gillig | |
| 5,334,952 A * | 8/1994 | Maddy et al. | 331/1 A |
| 5,497,126 A | 3/1996 | Kosiec et al. | |
| 5,659,268 A | 8/1997 | Kesner | |
| 5,663,685 A | 9/1997 | Kesner | |
| 6,794,913 B1 | 9/2004 | Stengel | |
| 7,111,186 B2 | 9/2006 | Han et al. | |
| 7,123,001 B2 * | 10/2006 | Loke et al. | 324/76.54 |
| 7,276,977 B2 | 10/2007 | Self | |
| 7,298,222 B2 | 11/2007 | Rosik et al. | |
| 7,375,593 B2 | 5/2008 | Self | |
| 7,433,262 B2 | 10/2008 | Vergnes et al. | |
| 7,471,934 B2 * | 12/2008 | Shi et al. | 455/114.2 |
| 7,579,886 B2 | 8/2009 | Hufford et al. | |
| 7,643,595 B2 * | 1/2010 | Aweya et al. | 375/356 |
| 7,719,529 B2 * | 5/2010 | Anderson et al. | 345/213 |
| 2002/0110211 A1 | 8/2002 | Bockelman | |
| 2003/0076175 A1 * | 4/2003 | Fischer et al. | 331/17 |
| 2005/0113053 A1 * | 5/2005 | Shi et al. | 455/260 |
| 2006/0056560 A1 * | 3/2006 | Aweya et al. | 375/356 |
| 2006/0066593 A1 * | 3/2006 | Anderson et al. | 345/204 |
| 2007/0035348 A1 * | 2/2007 | Self | 331/16 |
| 2008/0019464 A1 * | 1/2008 | Kloper et al. | 375/340 |
| 2009/0185650 A1 * | 7/2009 | Ravid et al. | 375/376 |
| 2009/0243735 A1 * | 10/2009 | Luiz et al. | 331/1 A |
| 2010/0023826 A1 | 1/2010 | Noguchi | |
| 2010/0085123 A1 | 4/2010 | Frans et al. | |
| 2010/0086081 A1 * | 4/2010 | Fujita et al. | 375/300 |
| 2010/0141316 A1 * | 6/2010 | Weltin-Wu et al. | 327/159 |
| 2010/0164561 A1 * | 7/2010 | Roberg et al. | 327/117 |
| 2011/0001524 A1 * | 1/2011 | Gendai | 327/156 |
| 2011/0041609 A1 * | 2/2011 | Clark et al. | 73/514.29 |
| 2011/0075781 A1 * | 3/2011 | Kenney | 375/376 |
| 2011/0156781 A1 * | 6/2011 | Ecklund et al. | 327/159 |

\* cited by examiner

*Primary Examiner* — Lincoln Donovan
*Assistant Examiner* — Adam Houston
(74) *Attorney, Agent, or Firm* — Barbara R. Doutre

(57) ABSTRACT

A frequency synthesizer that utilizes locked loop circuitry, for example delay locked loop and/or phase locked loop circuits is provided with a means for minimizing static phase/delay errors. An auto-tuning circuit and technique provide a measurement of static phase error by integrating the static phase error in the DLL/PLL circuit. A correction value is determined and applied as a current at the charge pump or as a time/phase offset at the phase detector to minimize static phase error. During normal operation the DLL/PLL is operated with the correction value resulting in substantially reduced spur levels and/or improved settling time.

25 Claims, 7 Drawing Sheets

METHOD AND APPARATUS FOR CORRECTING PHASE OFFSET ERRORS IN A COMMUNICATION DEVICE

FIELD OF THE DISCLOSURE

The present disclosure relates generally to electronic communication devices and more particularly to a method and apparatus for correcting static phase offset errors within the frequency synthesis operations of a communication device.

BACKGROUND

Communication products, such as two-way radios, cell phones, and the like, utilize frequency synthesizer circuits and frequency synthesis applications as a means of generating stable signals for use during transmit and receive modes of operation. Delay locked loop (DLL) circuits and phase locked loop (PLL) circuits typically form, either together or individually, a major part of the frequency synthesizer for any communication product. The DLL can be used in direct digital synthesis (DDS) applications while the PLL is typically utilized in more conventional frequency synthesis applications.

The use of a DLL and DLL applications may incur static phase offset errors which can generate spurs in the output signal. These spurs in the output signal are not desirable in a signal source that is used as a local oscillator in any transceiver system, as they might cause unwanted signals to appear along with the wanted signals. These spurs adversely affect blocking performance (e.g. adjacent channel), self quieters, spectral mask capabilities and electro-magnetic interference (EMI) in transceiver systems. Static phase offset errors inherent in these types of synthesizers are thus problematic.

The use of PLL and multiple loop PLL applications may incur static phase offset mismatch errors between loops which can create spurious glitches in a transient response that can negatively impact loop settling time. Static phase offset errors inherent in these types of synthesizers are thus also problematic.

Static phase-lock offset mismatch errors in adaptive loop bandwidth DLL/PLL systems is a dominant contributor to degrading synthesizer settling time. Therefore, adaptive-bandwidth DLL/PLL systems with large offset errors suffer from protracted settling times, negating much of the benefit of an adaptive-bandwidth scheme.

Additionally, the complexity and variation (across process, voltage, temperature) of current DLL and PLL and DLL/PLL systems burden users with expertise requirements, programming requirements and excessive system characterization requirements.

Accordingly, there is need for an improved approach to correcting static phase offset errors within frequency synthesizers of communication devices.

BRIEF DESCRIPTION OF THE FIGURES

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
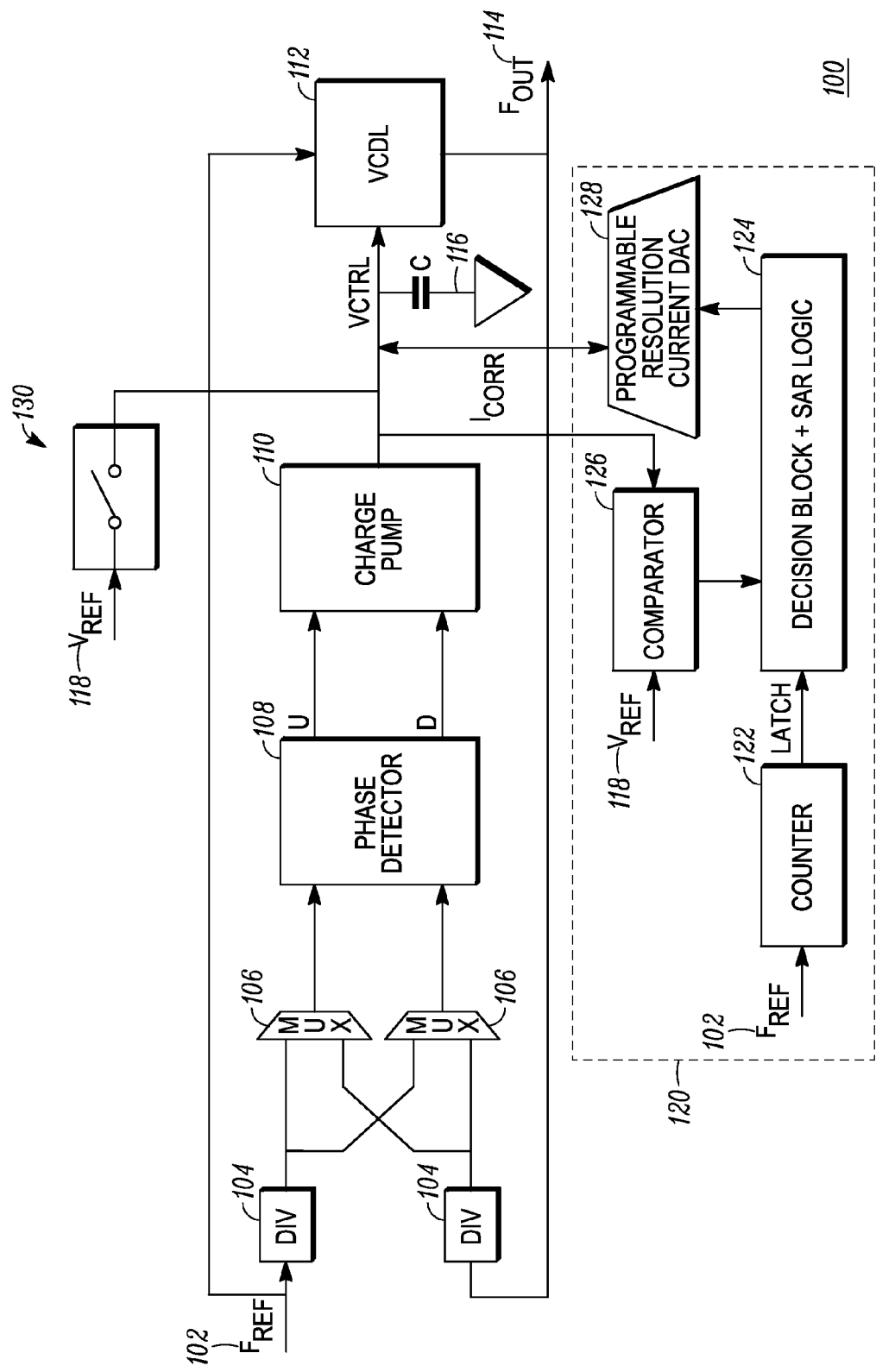
FIG. 1 is a block diagram of a delay locked loop (DLL) in accordance with an embodiment of the invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

Briefly, there is described herein, an autonomous correction system that measures and eliminates static delay and phase offset errors in a frequency synthesizer with programmable and scalable accuracy. The use of the correction system significantly lowers spurs in DLL-DDS systems and improves settling time in adaptive bandwidth PLL and PLL/DLL systems.

For the purposes of this application, static error is defined as systematic phase locking error in delay locked loop (DLL) or phase locked loop (PLL) systems due to non-idealities in phase frequency detectors and/or charge pumps. The causes of static errors include, for example, up/down mismatch errors in a phase frequency detector, charge pump currents and turn-on-times, and phase detector delays.

FIG. 1 is a delay lock loop (DLL) 100 for a frequency synthesizer formed and operating in accordance with the various embodiments of the invention. The DLL 100 receives a reference clock frequency ($F_{REF}$) 102 through operatively coupled dividers 104, multiplexers 106, phase detector 108, charge pump 110 and voltage control delay line (VCDL) 112 to generate an output frequency signal ($F_{OUT}$) 114. In accordance with an embodiment, an auto-tuning circuit 120 measures the static error of the DLL and provides a feedback mechanism that corrects for errors in the normal-mode of operation. Using the auto-tuning approach, the static error of DLL 100 can be reduced or totally eliminated so that it is not a main contributor to the output spurs. This is achieved without the use of external intervention, measurement or programming.

Figure 7:
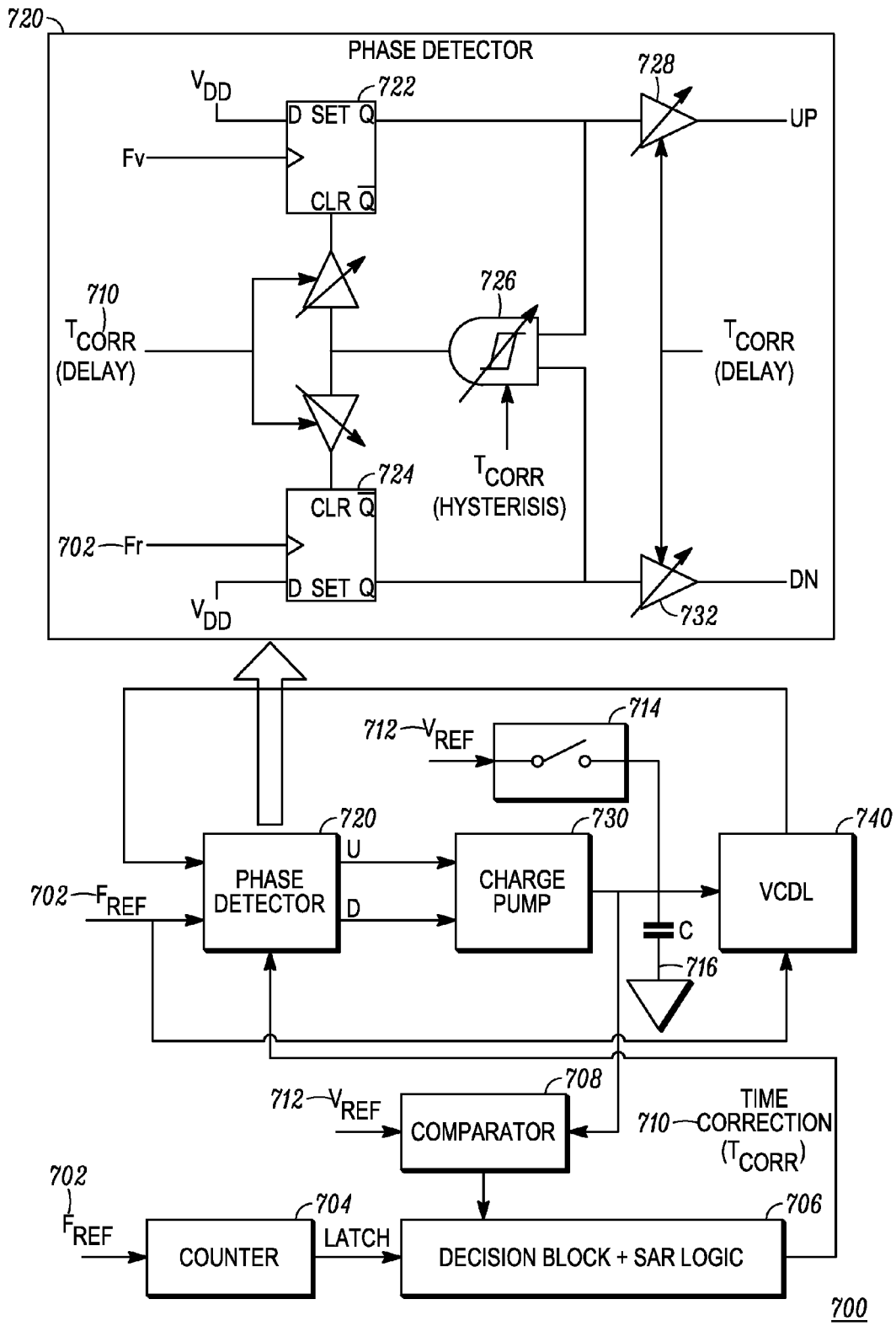
FIG. 7 is an alternative embodiment utilizing time/phase correction rather than current correction in accordance with an embodiment of the invention.

In accordance with an embodiment, the auto-tuning circuit 120 may be formed of a counter 122, decision and logic circuitry 124, a comparator 126 and a digital-to-analog converter (DAC) 128. In accordance with the embodiment, during the auto-tune mode either the $F_{REF}$ 102 or $F_{OUT}$ 114 is fed to both ports of the phase detector using input multiplexers 106 via optional dividers 104 to provide a zero phase offset reference. Simultaneously, the loop filter capacitor 116 is pre-charged to a reference voltage $V_{REF}$ using a switch 130. Once the pre-charge phase is over, the delay locked loop is activated and starts integrating the phase error. As the same signal is now fed to both ports of the phase detector 108 (either $F_{REF}$ or $F_{OUT}$), any static phase offset error due to non-idealities of the phase detector 108, charge pump 110 or any secondary effects will result in the control voltage VCTRL ramping in the positive or negative direction from $V_{REF}$. The control voltage VCTRL is then compared at comparator 126 to the reference voltage after a predetermined time set by the counter 122. Based on the comparator value, which is indicative of the static phase offset error in the DLL, a decision will be made by decision and logic circuit 124 to offset the error charge with charging/discharging current to the loop filter capacitor 116 using a correction current (Icorr) from the DAC 128 (as shown) or apply a time/phase offset to the phase detector 108 (FIG. 7). The DAC 128 may be implemented as a DAC current source or a DAC time delay source (programmable delay element). The current/time offset auto-tuning approach is repeated by setting the binary bits of the DAC using an iterative feedback control algorithm, such as a successive approximation register (SAR) algorithm, until the static error is minimized. Other analog to digital conversion methods/techniques and error minimizing algorithms such as binary search, least mean square (LMS) error, bi-section, step-by-step, random global minimum search, Newton, Newton-Raphson, sequential regression, dual slope, steepest descent etc., can also be used with decision and logic block 124. By reducing or totally eliminating static offset error in the DLL, the spur energy in the output frequency spectrum is reduced.

An averaging mode can also be applied to the frequency synthesizer in accordance with an embodiment. Using an averaging mode, the reference frequency signal ($F_{REF}$) is applied to both input ports of the phase detector 108 to determine a first correction word. The output frequency signal ($F_{OUT}$) is then applied to both of the input ports of the phase detector 108 to determine a second correction word. The average of the first correction word and the second correction word is taken at decision and logic circuitry 124 to generate a normal mode correction value. This approach provides an additional level of accuracy to the decision and logic circuitry 124.

Once the auto-tuning of DLL 100 is complete, the loop is set back into normal operation with $F_{REF}$ and $F_{OUT}$ being fed simultaneously to each distinct port of the phase detector 108. Correcting the static phase offset error using the auto-tuning loop 120 results in the DLL having an almost zero locking error. The auto-tuning approach can be applied once during initial startup of the delay lock operation and/or periodically based on aging or temperature variation profiles. The correction circuit's comparator offset can also be automatically tuned out initially by first measuring its offset when a replicate $V_{REF}$ signal applied to its two ports before running the complete auto-tune algorithm. The resolution of the DAC 128 can be scaled to trade off range, current, size/resolution and time for correction accuracy. For example, the current-scale (or time-scale) range of the DAC 128 can be adjusted to a given min/max interval for correcting phase offset errors within said interval, such that the wider the interval, the larger the error correction range yielding lower correction accuracy and visa versa.

In order to minimize or completely eliminate spurs, the delayed version of the reference clock is aligned as closely as possible to the desired value. The auto-tune circuit 120 provides a simple, realizable approach of accurately measuring the static delay associated with the delay lock loop 100 and correcting the same, thereby eliminating one of the major contributing factors for spurs and enabling other subsequent calibration techniques to achieve spurious free LO.

Figure 2:
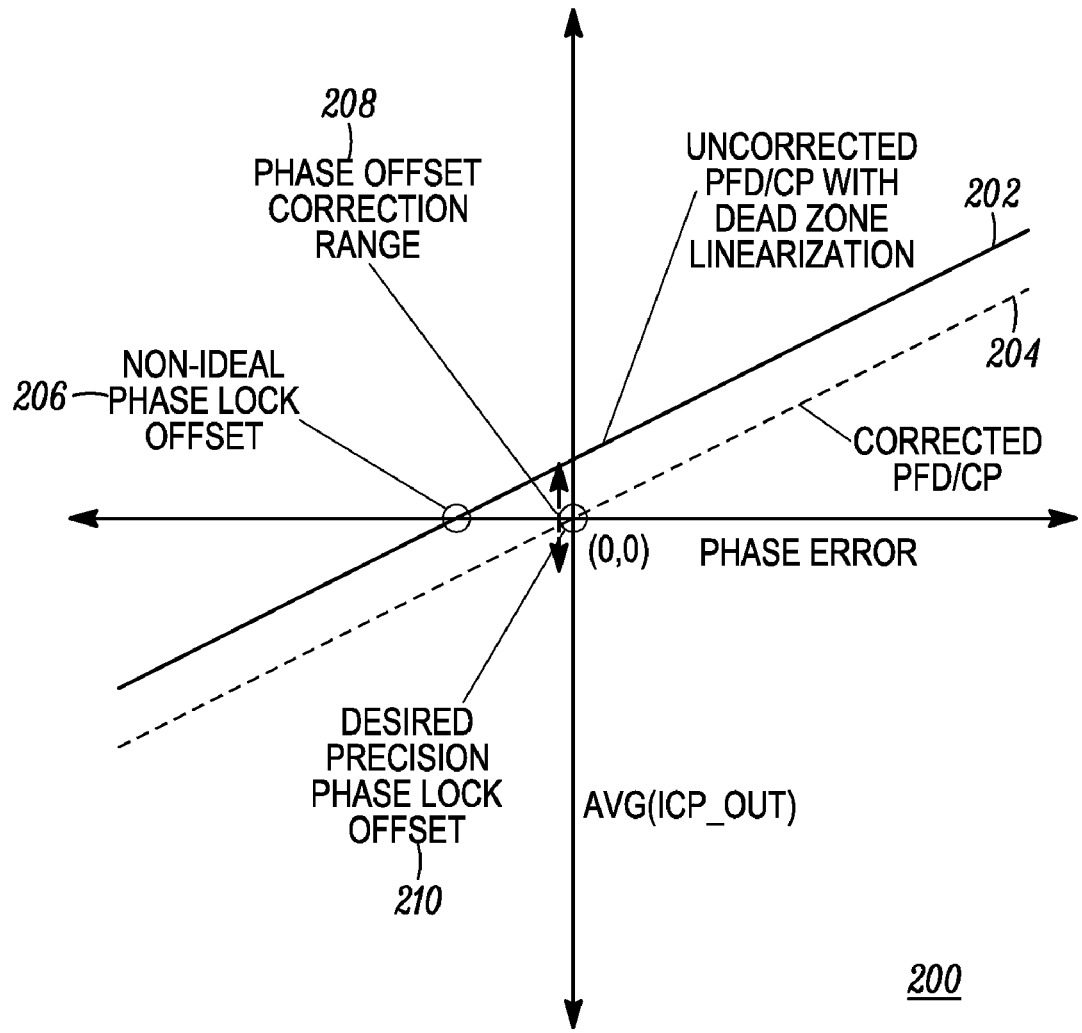
FIG. 2 is a diagram comparing corrected and uncorrected phase-frequency-detector (PFD)/charge pump (CP) transfer characteristics in accordance with an embodiment of the invention.

FIG. 2 shows a phase-frequency detector/charge pump transfer characteristic for a DLL or PLL circuit with and without the auto-tune approach. Designator 202 represents the uncorrected phase frequency detector or charge pump with dead zone linearization. Designator 206 indicates the non-ideal phase lock offset and designator 208 indicates the phase offset correction range. The corrected phase detector/charge pump 204 shows the precision phase lock offset as indicated by designator 210.

The apparatus and technique provides an autonomous correction system capable of accurately measuring and eliminating static delay/phase offset errors in the DLL system with programmable resolution. The correction system provides a discrete mode solution, mainly digital in nature using minimal additional circuitry or overhead. The advantages of the auto-correction system include: low discontinuous current drain, inherently process mismatch resistant, no noise/spurious-signal coupling issues. The correction system operating in accordance with the various embodiments provides scalable correction resolution which allows for a customized trade-off between accuracy and correction time. Additional benefits include minimal programming requirements, elimination of user involvement and elimination of system characterization.

Figure 3:
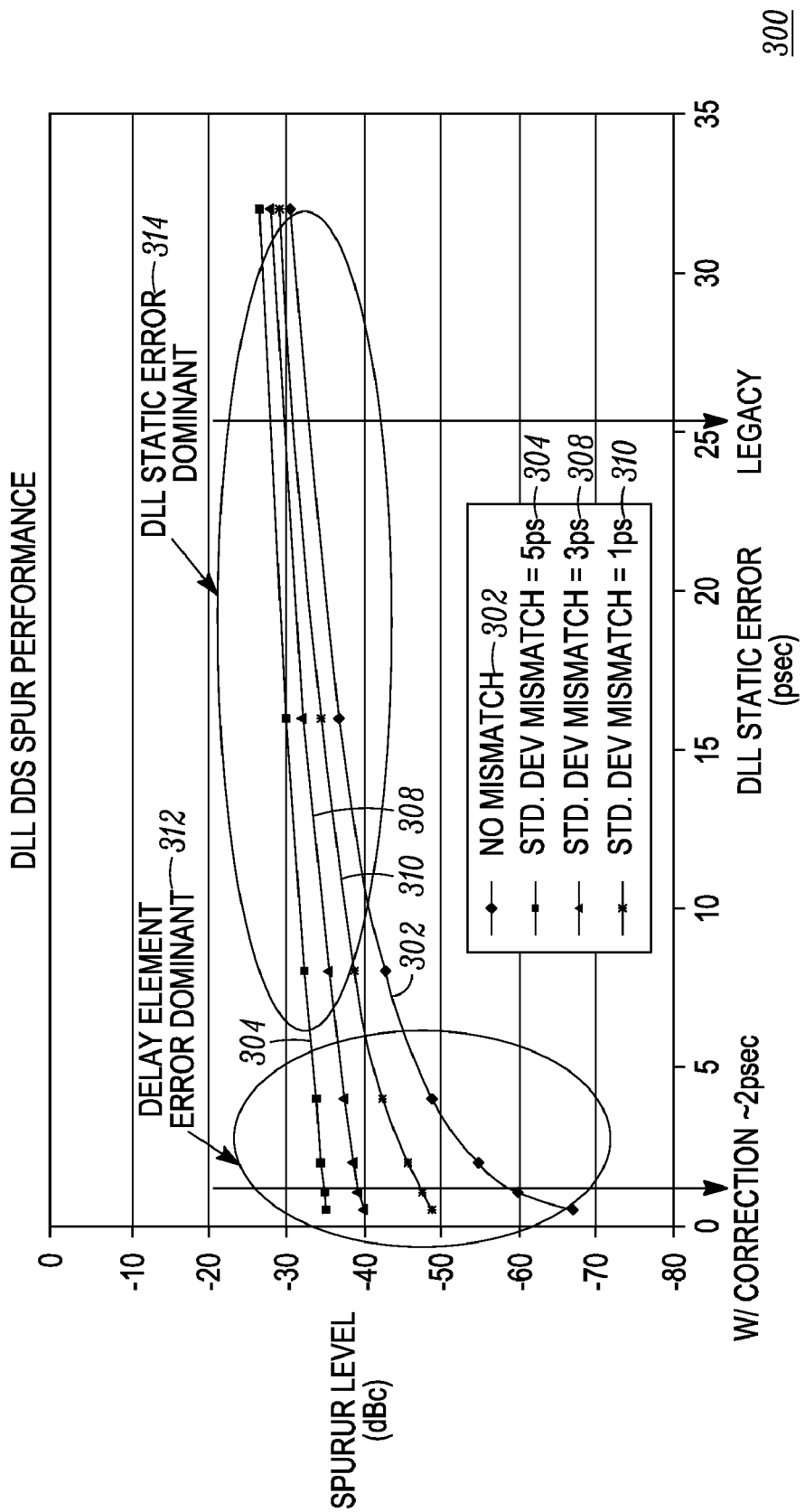
FIG. 3 shows an example of spur profiles resulting from static offset in the DLL and process mismatch error in the unit delay line element buffers that make up the VCDL in the DLL in accordance with an embodiment of the invention.

FIG. 3 shows a DDS spur profile example highlighting the static phase error vs. spur energy level. Major contribution to spur energy in a DLL based DDS is from both static phase offset DLL error and process mismatch error in the VCDL unit delay elements. The right side of the graph 300 shows the region where the DLL static error is dominant 314. Here the spur energy is totally dominated by static phase error of the DLL while completely masking the error contribution due to process mismatch errors from the VCDL unit delay elements. The left side of the graph 300 shows the region where the DLL static error is at its lowest and the process mismatch contribution from the delay line elements at 312 dominates the spur profile. Designators 302, 304, 308 and 310 show the spur profiles for various process mismatch errors with respect to DLL static phase offset error. Designator 302 shows no mismatch. Designator 304 shows a process mismatch with a standard deviation (sigma) of 5 ps. Designator 308 shows a process mismatch sigma of 3 ps, and designator 310 shows a process mismatch sigma of 1 ps. DDS spurs are a function of static phase offset error in DLL and VCDL unit delay element process mismatch error. Without correcting or reducing the former error first, the latter error correction ends up being ineffective. Thus, to reduce the amount of spur energy, it is desirable to eliminate the effect of DLL static phase error and move down the curve towards the left side of the graph where mismatch error becomes noticeable/dominant such that further mismatch correction techniques can be effectively applied to the delay elements themselves.

Figure 4:
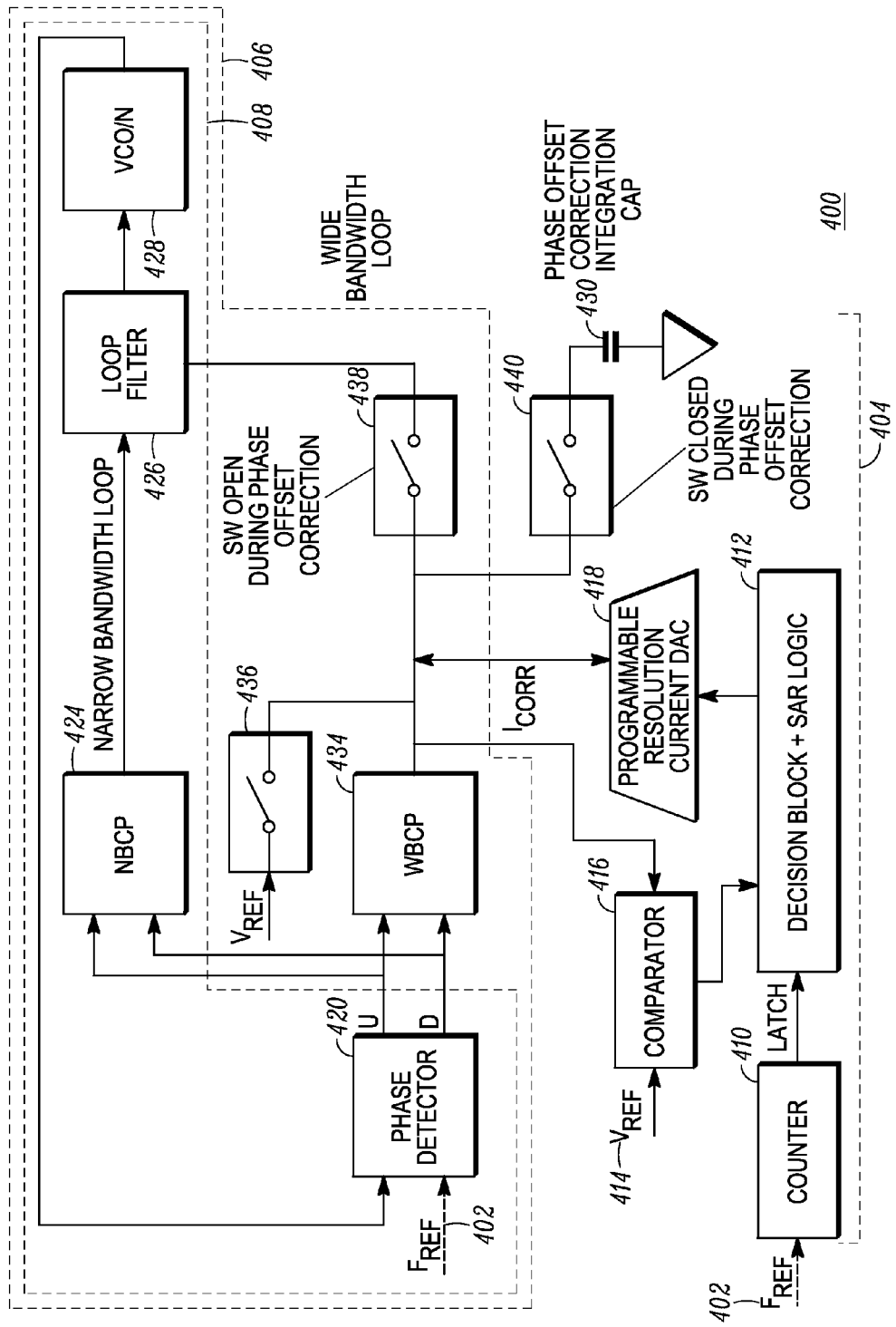
FIG. 4 shows a dual-loop phase locked loop circuit in accordance with an embodiment of the invention
Figure 5:
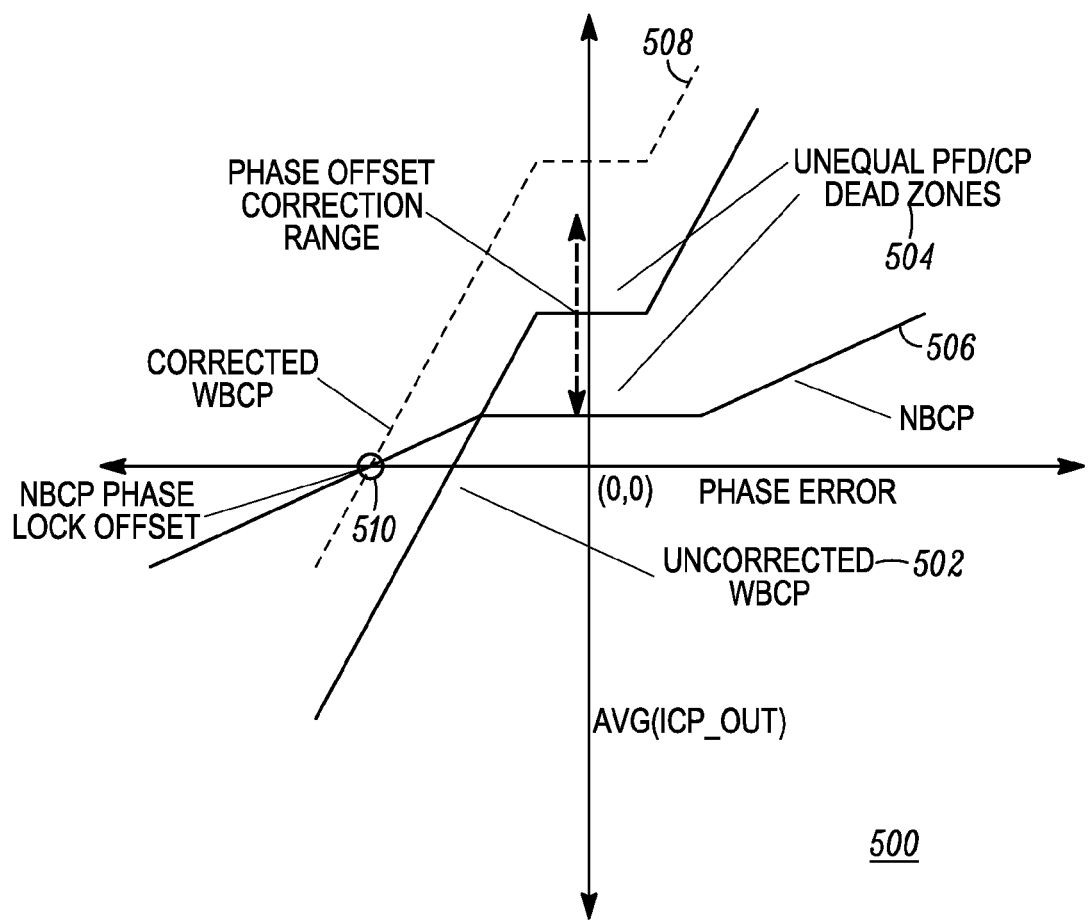
FIG. 5 shows a graph comparing corrected and uncorrected dual loop PLL bandwidth PFD/CP characteristics in accordance with an embodiment of the invention.
Figure 6:
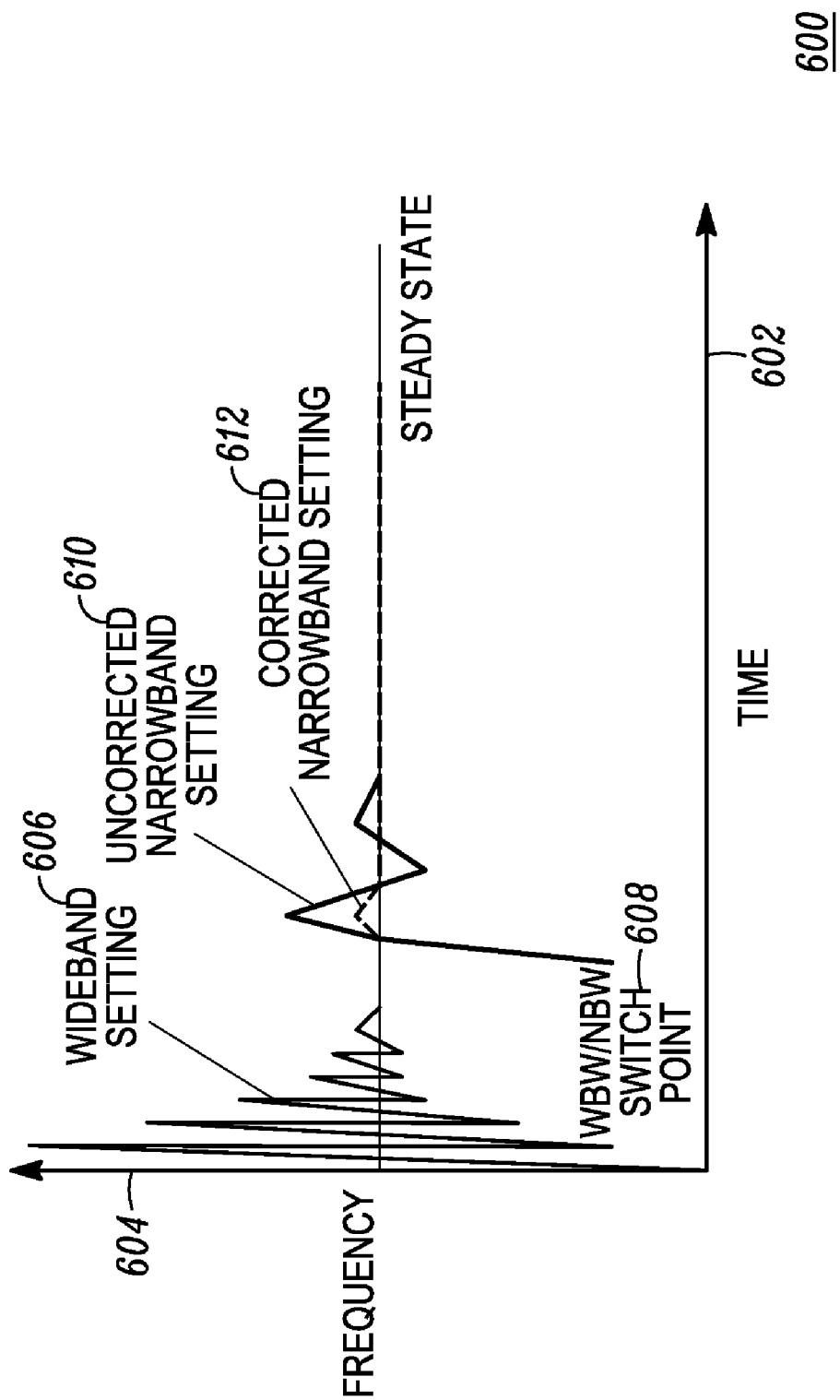
FIG. 6 shows a graph of dual loop bandwidth PLL frequency step response comparing corrected and uncorrected settling time in accordance with an embodiment of the invention.

FIGS. 4, 5 and 6 show how the auto-tune approach in accordance with the embodiments is also applicable to a PLL system. FIG. 4 shows a phase locked loop 400 in accordance with an embodiment. Phase-locked loop 400 receives a reference frequency 402 which is applied to a wide bandwidth (WBW) 406 and narrow bandwidth (NBW) 408 loop during adapt mode operation and then to only the NBW loop during normal mode operation. The PLL 400 includes phase detector 420, WBW charge-pump 434, NBW charge-pump 424, loop filter 426 and VCO/divider 428. A switch 438 switches the WBW loop 406 in and out of correction/measurement mode. A phase offset correction measurement capacitor 430 is switchably coupled, via switch 440, to the WBW charge-pump 434 during correction/measurement mode.

The auto-tune circuit 404 measures the phase offset mismatch error between the NBW and WBW loops and minimizes the error, a correction value is then applied during normal operation thereby minimizing transients and settling time when the WBW loop 406 is turned off during normal transient operation.

In accordance with an embodiment, the auto-tuning circuit 404 may be formed of a counter 410, decision and logic circuitry 412, a comparator 416 and a digital-to-analog converter (DAC) 418. In accordance with the embodiment, during the auto-tune mode, the PLL is locked using only the NBW loop 408 with the WBW loop 406 opened up via switch 438 thereby creating the reference phase offset to which the WBW loop phase offset error is to be matched. Simultaneously, the correction/measurement capacitor 430 is switched (via switch 440) into the WBW charge pump and pre-charged to a reference voltage $V_{REF}$ using switch 436. Once the pre-charge phase is over, the measurement capacitor 430 starts integrating the phase offset mismatch error from the WBW loop. Any phase offset mismatch error between the NBW and WBW loop due to non-idealities of the phase detector, charge pump or any secondary effects will result in the measurement capacitor's 430 voltage ramping in either the positive or negative direction from $V_{REF}$. The voltage is then compared at comparator 416 to the reference voltage after a predetermined time set by the counter 410. Based on the comparator value, which is indicative of the phase offset mismatch error between the NBW and WBW loops, a decision will be made by decision and logic circuit 412 to offset the error charge by charging/discharging current to the measurement capacitor 430 using a correction current (Icorr) from the DAC 418 (as shown) or apply a time/phase offset to the phase detector 420 (applicable to FIG. 7). The DAC 418 may be implemented as a DAC current source or a DAC time delay source (programmable delay element). The current/time offset auto-tuning approach is repeated by setting the binary bits of the DAC using an iterative algorithm, such as a successive approximation register (SAR) algorithm, until the phase error mismatch is minimized. Other analog to digital conversion methods/techniques and error minimizing algorithms such as binary search, least mean square (LMS) error, bi-section, step-by-step, random global minimum search, Newton, Newton-Raphson, sequential regression, dual slope, steepest descent etc., can also be used with decision and logic block 412. By reducing or totally eliminating phase offset mismatch error between the NBW and WBW loops in the PLL, the transient settling time of the output frequency is reduced.

The auto-tune apparatus and technique provides an autonomous correction system capable of accurately measuring and eliminating static delay/phase offset mismatch errors in a multiple loop PLL system with programmable resolution. During auto-tune mode, the WBW loop path phase-lock offset is matched to the NBW loop path phase-lock offset resulting in a WBW loop phase-offset correction value. The correction value is applied to the WBW charge-pump to reduce phase-lock mismatch between the WBW and NBW loops. During normal operation, the PLL is operated using the correction value from auto tuning resulting in reduced transients and improved settling time.

Referring to FIG. 5, there is shown a graph 500 comparing phase frequency/charge pump characteristic for the PLL system of FIG. 4. The different phase locking angles between the two PFD/CP characteristics are due to both the up and down charge pump current mismatches between the NBW charge pump 408 and the WBW charge-pump 406 similar to the previous discussion of the DLL application. However, the more significant cause in the phase-lock difference can be the different dead-zone widths resulting from the inherently different turn on/off times between the NBW charge pump 408 and WBW charge pump 406. Designator 502 represents the unwanted WBW charge-pump phase offset. Designator 504 represents an unequal PFD/CP dead zones that occur from charge-pump turn on/off time mismatch. Designator 508 represents the corrected WBW charge-pump phase offset. The WBW phase lock offset is now matched to the NBW phase lock offset at 510 with the phase lock mismatch error minimized or eliminated.

FIG. 6 shows a graph 600 comparing an example of phase offset mismatch error correction in an adaptive bandwidth PLL (adapt-BW PLL) system operating in accordance the system of FIG. 4. Graph 600 shows frequency 604 versus time 602. Initial WBW settling time 606 represents the settling time for loop 406 which is followed by switching off the WBW loop 406 to only the NBW loop 408 at point 608 followed by a graphical comparison of uncorrected NBW settling time 610 and corrected NBW settling time 612. A significant improvement in transient response and settling time improvement is achieved using the correction system in accordance with the various embodiments.

As with the DLL system, the apparatus and technique provides an autonomous correction system capable of accurately measuring and eliminating delay/phase offset mismatch errors between the NBW and WBW loop in an adaptive loop bandwidth PLL system with programmable resolution. The correction system provides a discrete mode solution, mainly digital in nature using minimal additional circuitry or overhead. The advantages of the auto-correction system include low discontinuous current drain, inherently process mismatch resistant, and no noise/spurious-signal coupling issues. The correction system operating in accordance with the various embodiments provides scalable correction resolution which allows for a customized trade-off between accuracy and correction time. Additional benefits include minimal programming requirements, elimination of user involvement and elimination of system characterization.

FIG. 7 shows an alternative embodiment in which time correction, as mentioned previously, can be used instead of current/charge pump correction. The auto-tuning remains unchanged except for where the correction is applied. The auto-tune circuit receives the reference frequency signal 702 and applies it to counter 704 while a reference voltage 712 is applied to comparator 708. A decision and logic block 706 receives the comparator value and the decision and logic circuit generates a corrected value. The phase detector 720 receives the corrected value. An example phase detector 720 includes logic gates 722, 724, and hysteresis 726 to logic buffers 728, 732 generating the up/down outputs to the charge pump 730. Capacitor 716 is switchably pre-charged by switch 714 at the input of the voltage controlled delay line 740 during correction/measurement operation. The time correction mechanism shown in FIG. 7 can also apply as an alternate embodiment to a multiple loop or adaptive bandwidth PLL in which phase detector delays are adjusted instead of charge pump currents.

In accordance with all the various embodiments, a single programmable bit is used to enable the auto-tuning circuit and algorithms. The auto-tuning circuit and algorithm (e.g. SAR) for both DLL-DDS and adapt-BW PLL circuits can be detected by monitoring PFD/CP supply current vs. time (which shows the stepping up/down of the PFD/CP current due to the DAC being applied in the correction algorithm) while also monitoring output spectrum spur level vs. frequency (which shows the iterative reduction in the spur levels) in the case of DLL-DDS. Monitoring the output frequency vs. time shows when the auto-tuning correction is applied versus when it is not in the case of the adapt-BW PLL.

The auto-tuning circuit and algorithm for both DLL-DDS and adapt-BW PLL are also detectible through monitoring charge pump output currents and control voltages vs. time (which shows the stepping up/down of the charge pump output current due to the DAC being applied in the correction algorithm and the voltage reference ($V_{REF}$) switching in/out during correction mode). Monitoring the output frequency vs. time shows when the auto-tuning correction is applied versus when the auto-tuning correction is not applied. Monitoring the output spectrum spur level vs. frequency shows the iterative reduction in the spur levels in the case of DLL-DDS. Monitoring the output frequency vs. time shows when the auto-tuning correction is applied versus when it is not, in the case of the adapt-BW PLL.

Accordingly, there has been provided an auto-tune system that improves phase offset error in locked loop systems, including DLL, PLL and combination DLL/PLL systems. The auto-tune system improves spur performance and minimizes user-interface complexity and eliminates the need for characterization in DLL/PLL circuits. The correction apparatus and technique operating in accordance with the various embodiments realizes the full settling-time benefit of an adaptive-bandwidth scheme in PLL circuits. Transceiver performance (such as transient spectral mask, operating current drain, faster switching time in time-multiplexed systems, and spectral purity) using both DLL and PLL circuits is improved as a result of an improved LO source.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A frequency synthesizer, comprising:
    a phase detector;
    a charge pump;
    locked loop circuitry operating in conjunction with the phase detector and charge pump (PFD/CP); and
    an auto-tuning circuit providing a measurement of static phase error by integrating the static phase error in the locked loop circuitry and generating a correction value to apply as current at the charge pump.

2. The frequency synthesizer of claim 1, wherein the locked loop circuitry comprises one or more of:
    delay locked loop (DLL) circuitry;
    phase locked loop (PLL) circuitry.

3. The frequency synthesizer of claim 2, wherein the auto-tuning circuit comprises:
    decision and logic circuitry operating under a feedback control algorithm for receiving a signal indicative of the static phase offset error and generating a correction value to apply to the synthesizer to minimize the static phase offset error.

4. The frequency synthesizer of claim 3, wherein a single programmable bit is used to enable the auto-tuning circuit.

5. The frequency synthesizer of claim 4, wherein supply current vs. time for the PFD/CP indicates stepping up/down of PFD/CP current.

6. The frequency synthesizer of claim 4, wherein output spectrum spur level vs. frequency indicates an iterative reduction in the spur levels for the DLL.

7. The frequency synthesizer of claim 4, wherein output frequency vs. time indicates when the auto-tuning correction is applied versus when it is not in the PLL.

8. The frequency synthesizer of claim 1, wherein the locked loop circuitry comprises DLL circuitry and the correction value is obtained by averaging a first correction word with a second correction word, the first correction word being generated in response to a reference frequency signal ($F_{REF}$) being applied to first and second input ports of the phase detector, and the second correction word then being generated in response to an output frequency signal ($F_{OUT}$) being applied to the first and second input ports of the phase detector.

9. A delay locked loop for a frequency synthesizer, comprising:
- a phase detector having first and second ports for receiving either a reference clock frequency or a DLL frequency output signal through first and second multiplexed input ports;
- a charge pump coupled to the phase detector, the charge pump generating a delay line voltage control signal;
- a voltage controlled delay line coupled to the charge pump, the voltage controlled delay line receiving the reference frequency and the delay line voltage control signal and generating the DLL frequency output signal;
- a loop filter capacitor coupled to the voltage control delay line;
- an auto-tuning circuit for receiving the reference frequency signal, a voltage reference signal and the delay line voltage control signal, the auto-tuning circuit generating a correction signal to minimize static error in the voltage control line.

10. A delay locked loop of claim 9, wherein the auto-tuning circuit comprises:
- a counter for receiving the reference frequency;
- a comparator for comparing the reference voltage to the delay line control voltage signal and generating a comparator value representing the static error after a predetermined time set by the counter;
- a decision and logic circuit for receiving the comparator value and generating a correction value; and
- a digital-to-analog converter (DAC) for converting the correction value to an analog correction value signal to the loop filter capacitor.

11. The frequency synthesizer of claim 10, wherein the auto-tuning circuit is controlled by one or more of the following correction schemes: successive approximation register (SAR) algorithm, binary search, least mean square (LMS) error, bi-section, step-by-step, random global minimum search, Newton, Newton-Raphson, sequential regression, dual slope, steepest descent.

12. The delay locked loop of claim 10, wherein the correction value is applied as a current at the charge pump.

13. The delay locked loop of claim 10, wherein the correction value is applied as a time/phase offset to the phase detector.

14. The delay locked loop of claim 10, wherein the comparator has an initial comparator offset, the initial comparator offset being automatically tuned out by adjusting the comparator offset with a replicate voltage reference signal applied to both ports of the comparator prior to applying the auto-tune circuit.

15. The delay locked loop of claim 10, wherein a resolution associated with the DAC is scalable to trade off range, current, size/resolution and correction time for correction accuracy.

16. A frequency synthesizer, comprising:
- a phase-lock loop (PLL) having a wide bandwidth loop and a narrow bandwidth loop;
- a wideband charge-pump for generating a wide loop bandwidth signal within the wide bandwidth loop during adapt-mode operation;
- a narrowband charge-pump for generating a narrow loop bandwidth signal within the narrow bandwidth loop during normal-mode operation;
- a comparator for comparing the wideband charge-pump output with a reference value and generating a comparator output indicative of static phase offset error;
- a phase offset correction current applied to the wideband charge-pump; and
- an auto-tune circuit for adjusting the comparator value for phase lock mismatch minimization/elimination and generating a correction value, the correction value being applied to the phase offset correction current thereby minimizing transients and settling time when switching between the wideband loop to the narrowband loop.

17. The frequency synthesizer of claim 16, wherein the auto-tune circuit is controlled by one or more of the following correction schemes: successive approximation register (SAR) algorithm, binary search, least mean square (LMS) error, bi-section, step-by-step, random global minimum search, Newton, Newton-Raphson, sequential regression, dual slope, steepest descent.

18. The frequency synthesizer of claim 16, wherein the auto-tune circuit comprises:
- a decision and logic circuit coupled to an output of the comparator;
- a counter coupled to an input of the decision and logic circuit; and
- a digital to analog converter coupled to an output of the decision and logic circuit.

19. The frequency synthesizer of claim 16, wherein the correction value is applied as a current at the wideband charge-pump.

20. The frequency synthesizer of claim 16, wherein the wideband loop further comprises a phase detector and the correction value is applied as a time offset to the phase detector.

21. A method for auto-tuning a synthesizer having a phase detector and a charge pump, comprising:
- measuring static phase error at an output signal;
- integrating the static phase error in the synthesizer;
- generating a correction value based on the integrated static phase error using a feedback control algorithm;
- and applying the correction value to a synthesizer control signal.

22. The method of claim 21, wherein generating a correction value further comprises applying an averaging mode comprising:
- applying a reference frequency signal ($F_{REF}$) to both input ports of the phase detector to determine a first correction word; and applying an output frequency signal ($F_{OUT}$) to both of the input ports of the phase detector to determine a second correction word;
taking the average of the first correction word and the second correction word; and
applying the average as a normal mode correction value to the synthesizer control signal.

23. The method of claim 21, wherein the synthesizer comprises at least one of a delay locked loop direct digital synthesis (DLL-DDS), adapt bandwidth phase locked loop (adapt-BW PLL).

24. The method of claim 21, wherein applying the correction value to a synthesizer control signal comprises applying the correction value as a current at the charge pump.

25. The method of claim 21, wherein applying the correction value to a synthesizer control signal comprises applying the correction value as a time/phase offset to the phase detector.

* * * * *

UNITED STATES PATENT AND TRADEMARK OFFICE
CERTIFICATE OF CORRECTION

PATENT NO.        : 8,134,393 B1
APPLICATION NO.   : 12/893266
DATED             : March 13, 2012
INVENTOR(S)       : Nagaraj et al.

It is certified that error appears in the above-identified patent and that said Letters Patent is hereby corrected as shown below:

In Column 2, Line 10, delete "invention" and insert -- invention. --, therefor.

In Column 9, Line 59, in Claim 11, delete "frequency synthesizer" and insert -- delay locked loop --, therefor.

Signed and Sealed this
Eighteenth Day of December, 2012

David J. Kappos
*Director of the United States Patent and Trademark Office*